(12) United States Patent
Chiang et al.

(10) Patent No.: US 6,555,435 B2
(45) Date of Patent: *Apr. 29, 2003

(54) METHOD TO ELIMINATE SHORTS BETWEEN ADJACENT CONTACTS DUE TO INTERLEVEL DIELECTRIC VOIDS

(75) Inventors: Ming-Hsiung Chiang, Taipei (TW); James Wu, Kao-Hsiung (TW); Yu-Hua Lee, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/087,070

(22) Filed: Mar. 1, 2002

(65) Prior Publication Data

US 2002/0094644 A1 Jul. 18, 2002

Related U.S. Application Data

(63) Continuation of application No. 09/318,470, filed on May 25, 1999, now Pat. No. 6,365,464.

(51) Int. Cl.[7] .............................................. H01L 2/336
(52) U.S. Cl. ...................... 438/279; 438/303; 438/305; 257/277; 257/403
(58) Field of Search ................................ 438/305, 546, 438/586, 639; 257/407, 377

(56) References Cited

U.S. PATENT DOCUMENTS 5,665,657 A    9/1997  Lee .............................. 438/624
5,728,596 A  *  3/1998  Prall ............................ 438/586
5,728,631 A    3/1998  Wang ........................... 438/787
5,783,481 A    7/1998  Brennan et al. ............. 438/623
5,905,393 A  *  5/1999  Jeng et al. .................. 257/408
5,914,518 A  *  6/1999  Nguyen et al. ............. 438/546

* cited by examiner

Primary Examiner—David Nelms
Assistant Examiner—Dung A Le
(74) Attorney, Agent, or Firm—George O. Saile; Stephen B. Ackerman; Douglas R. Schnabel

(57) ABSTRACT

A method to form contacts in an integrated circuit device comprising to eliminate shorting between adjacent contacts due to dielectric layer voids is achieved. A substrate is provided. Narrowly spaced conductive lines are provided on the substrate. A dielectric layer is deposited overlying the conductive lines and the substrate. The dielectric layer is etched through to the top surface of the substrate in areas defined by lithographic mask to form contact openings between adjacent narrowly spaced conductive lines. An insulating layer is deposited overlying the dielectric layer and filling the contact openings wherein the insulating layer forms a lining layer inside the contact openings and fills any voids in the dielectric layer extending out of the contact openings. The insulating layer is etched through to expose the top surface of the substrate. A conductive layer is deposited overlying the dielectric layer and filling the contact openings. The conductive layer is etched as defined by lithographic mask. A passivation layer is deposited overlying the conductive layer and the dielectric layer. The integrated circuit device is completed.

2 Claims, 5 Drawing Sheets

US 6,555,435 B2

METHOD TO ELIMINATE SHORTS BETWEEN ADJACENT CONTACTS DUE TO INTERLEVEL DIELECTRIC VOIDS

This is a Continuation of Patent Application under 37 CFR 1.114, application Ser. No. 09/318,470, filing date May 25, 1999, now U.S. Pat. No. 6,365,464 assigned to the same assignee as the present invention.

BACKGROUND OF THE INVENTION

1) Field of the Invention

The present invention relates to the fabrication of semiconductor devices, and more particularly, to a method to eliminate shorts between adjacent contacts due to interlevel dielectric voids in the manufacture of integrated circuits.

2) Description of the Prior Art

Feature size reduction is essential for realizing increased device content and higher switching speeds on integrated circuits. This size reduction trend is especially true for dynamic random access memory (DRAM) technology where device sizes of 0.25 microns are now in fabrication. At physical dimensions this small, it is often difficult to deposit dielectric material over very closely spaced features without creating gaps or voids in the dielectric material.

In FIG. 1, a cross-section of a partially-completed DRAM integrated circuit is shown. Two wordline transistors 50 are shown with gate dielectrics of silicon oxide 14, polysilicon gate nodes 18, and silicon nitride sidewalls 26 and caps 22. Heavily doped and lightly doped sources and drains 30 and 34, respectively, have been implanted into a semiconductor substrate 10. A layer of dielectric 38 comprised of silicon oxide overlays the wordline transistors 50 and the surface of the substrate 10.

A problem typical to the art is shown in FIG. 1. The wordline transistors 50 have a spacing S1 of about 0.25 microns. At this close spacing, air gaps, voids, or keyholes 42 will form in the dielectric oxide layer 38 in the area between the two wordlines. These air gaps can be either helpful or harmful to the integrated circuit depending on subsequent processing. Air gaps in the dielectric can be helpful because the dielectric constant of air is much less than that of silicon oxide. The capacitive coupling between the two transistors can be reduced by the air gap. This improves circuit performance. These voids can cause real problems, however, in situations where the compromised integrity of the dielectric can allow a shorting condition to occur.

FIG. 2 and FIG. 3 show what happens if a contact opening is created in the area where the dielectric void has occurred. Referring to FIG. 2, a contact opening has been etched through the dielectric layer 38 to the surface of the substrate 10 to allow contact between the bitline of the DRAM and the circuitry above the dielectric layer. The contact hole vertically intersects the void 42. Void 42 is shown in the background of the cross section depicted in FIG. 2. Effectively, the void constitutes a shaft extending from the contact hole out into the dielectric layer. A metal layer 54 is shown deposited overlying the dielectric layer and filling the contact hole. Unfortunately, the metal layer also fills the void 42. Metal material in the void represents a definite risk for shorting out the circuit.

Referring now to FIG. 3, the problem is shown more fully depicted. FIG. 3 represents a top view of the partially-completed structure shown in FIG. 2. In FIG. 3, two adjacent contact holes are shown which lie between the two closely spaced MOS gate wordlines 50. Both of the contacts are filled with metal layer 54. To work properly, each contact hole must be physically and electrically isolated from the other by the dielectric layer 38. Unfortunately, the void 42 in the dielectric layer 38 runs from one contact opening to the other and is causing each of the contact holes to be shorted together by the metal layer contained in the void.

Several prior art approaches attempt to address the problems of air voids in the dielectric layer. U.S. Pat. No. 5,665,657 to Lee teaches a method to remove voids in spin-on glass layers by using an etch and fill method. U.S. Pat. No. 5,728,631 to Wang discloses a method to form low capacitance dielectric voids between adjacent metal lines by an electrocyclotron resonance etching deposition technique. U.S. Pat. No. 5,783,481 to Brennan et al teaches a method to form air gaps in the interlevel dielectric by using polyimide film.

SUMMARY OF THE INVENTION

A principal object of the present invention is to provide an effective and very manufacturable method of fabricating contact openings in the manufacture of integrated circuits.

A further object of the present invention is to provide a method to fabricate contact openings that prevents conductive shorts caused by air voids in the dielectric layer between narrowly-spaced adjacent conductive lines.

Another object of the present invention is to provide a method to prevent conductive shorts caused by air voids in the dielectric layer between narrowly-spaced adjacent conductive lines by lining contact openings with an insulating dielectric layer to fill exposed voids.

In accordance with the objects of this invention, a new method for fabricating contact openings in an integrated circuit is achieved. This method prevents conductive shorts caused by air voids in the dielectric layer between narrowly spaced adjacent conductive lines. An insulating dielectric layer is used to line contact openings and to fill any exposed voids. A semiconductor substrate is provided having narrowly spaced first conductive lines. The conductive lines may be MOS transistor gates, metal traces, or polysilicon traces. A dielectric layer is formed overlying the first conductive lines and the substrate. Contact openings are etched through the dielectric layer as defined by lithography. An insulating oxide layer is deposited overlying the dielectric layer and lining the contact openings. The insulating lining fills any dielectric air voids exposed by the contact opening etch. A conductive layer is deposited filling the contact openings and overlying the dielectric layer. The conductive layer is etched to define connectivity as defined by lithography. A passivation layer is deposited overlying the conductive layer and the dielectric layer to complete the integrated circuit.

BRIEF DESCRIPTION OF THE DRAWINGS

In the accompanying drawings forming a material part of this description, there is shown.

DESCRIPTION OF THE PREFERRED EMBODIMENTS

In the preferred embodiment, the present invention will be shown applied to the formation of contact openings between two closely spaced MOS transistor gates. As will be obvious to those skilled in the art, the invention can easily be used to form contact openings between any closely spaced conductive traces. For example, instead of transistor gates, the present invention might be applied to closely spaced polysilicon traces overlying thick field oxide. In addition, metal traces overlying thick field oxide could be substituted for the transistor gates shown in the preferred embodiments. Such metal traces could be comprised preferably of aluminum, copper, or an alloy of aluminum and copper. Any application where metal or polysilicon traces or polysilicon gates are closely spaced can cause air voids to occur in the dielectric layer. The present invention will solve the potential contact shorting problem in any of these applications.

Figure 1:
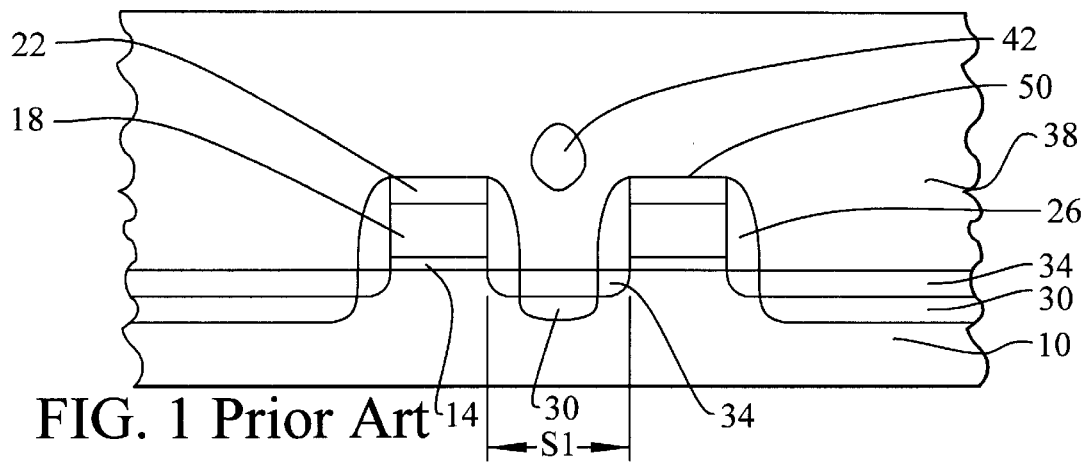
FIGS. 1 and 2 schematically illustrate in cross-section a partially completed prior art integrated circuit showing the problem of air voids inducing conductive shorts.
Figure 2:
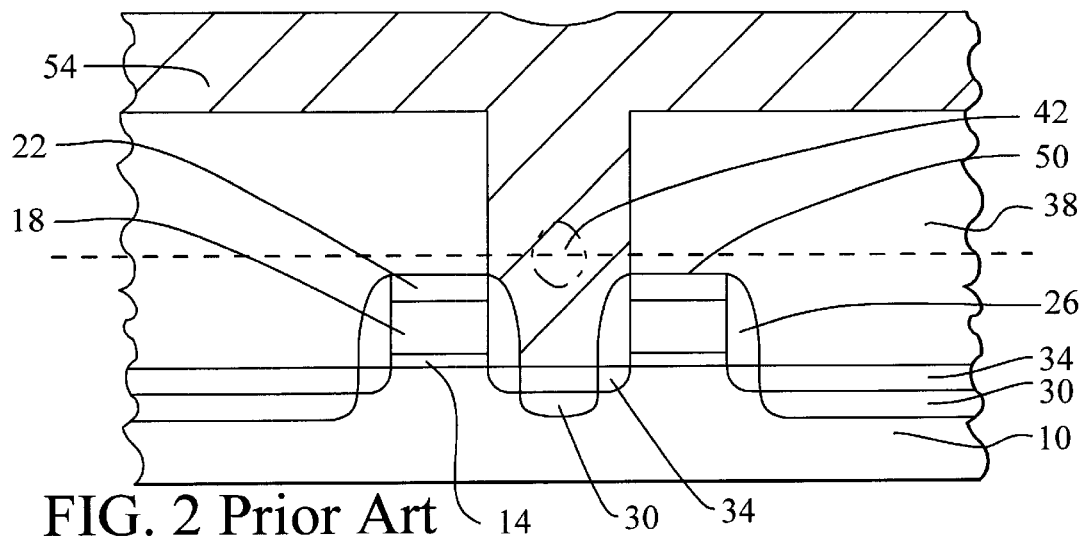
Figure 3:
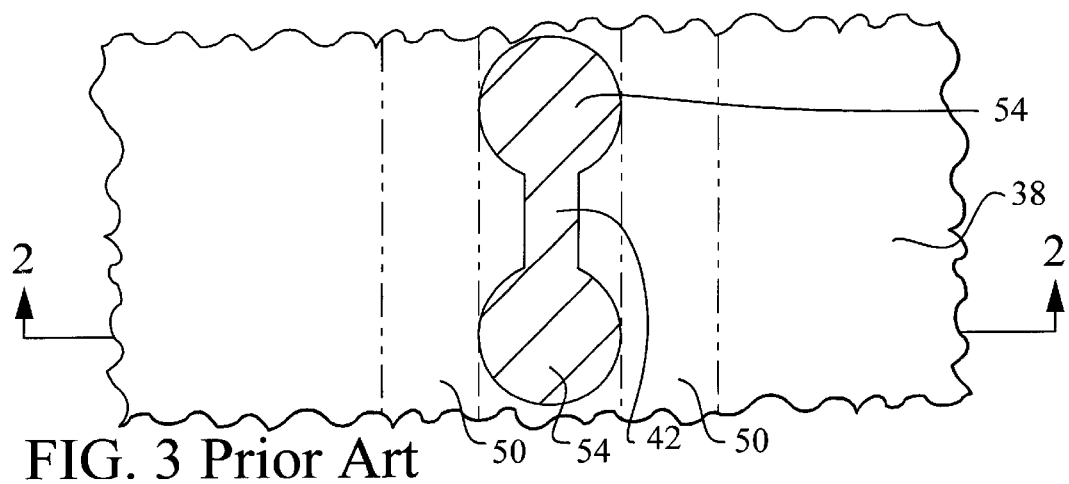
FIG. 3 is a top view of the view 2—2 shown in FIG. 2.
Figure 4:
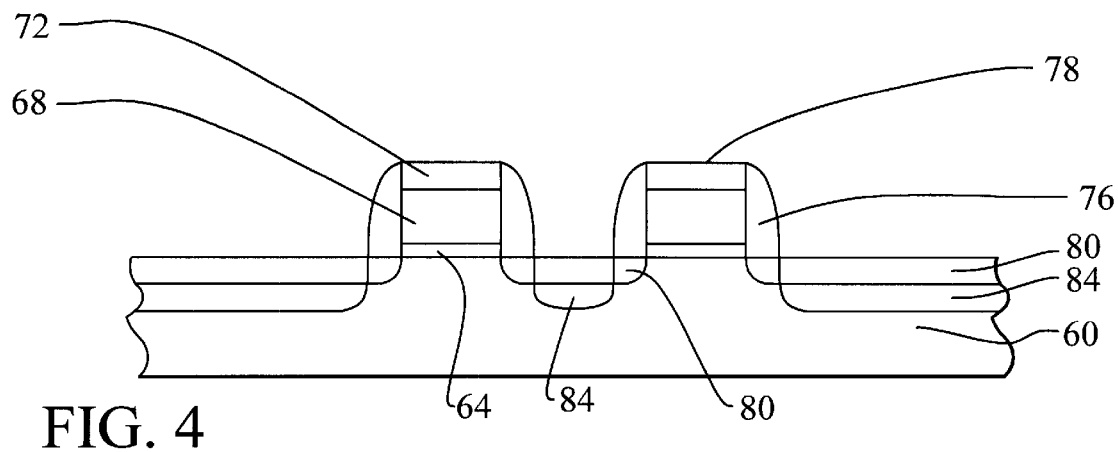
FIGS. 4 through 7, and 9 through 11, schematically illustrate in cross-sectional representation a preferred embodiment of the present invention.

Referring now more particularly to FIG. 4, there is illustrated a portion of a partially completed integrated circuit. A semiconductor substrate 60 is preferably composed of monocrystalline silicon. MOS transistor gates 78 have been formed on the substrate 60 surface by conventional processing. The MOS transistor gates 78 are comprised of silicon oxide gate dielectric 64, polysilicon gate electrode 68, and silicon nitride gate cap 72 and sidewalls 76. Into the substrate 60, highly doped junctions 84 and lightly doped junctions 80 have been formed by self-aligned ion implantation as is conventional in the art. The MOS transistors 78 in the preferred embodiment are described as wordlines in DRAM memory cells. The substrate junctions 80, 84 are described as DRAM bitline contacts. Additionally, the MOS transistor gates 78 could be used in logic or analog circuitry without changing the critical details of the present invention.

Figure 5:
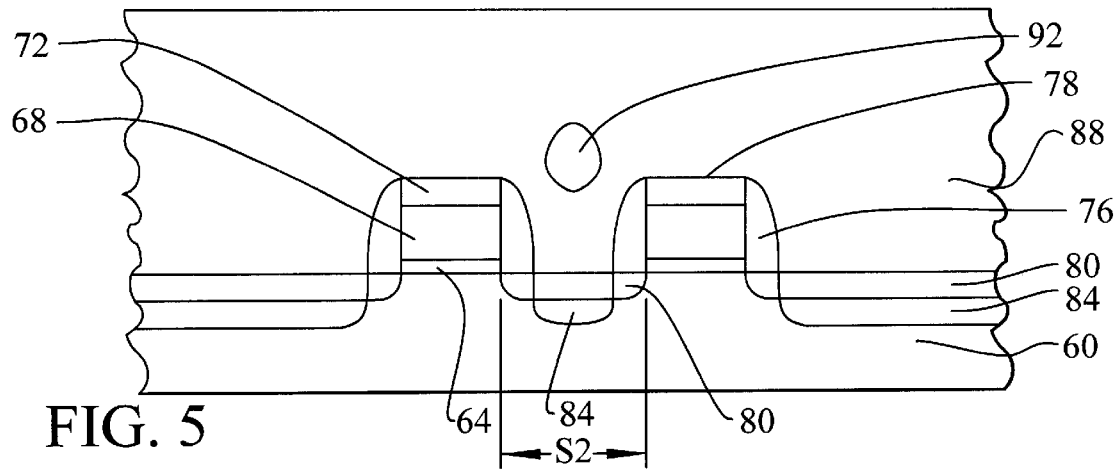

Referring now to FIG. 5, a dielectric layer 88 is deposited overlying the MOS transistor gates 78 and the surface of the substrate 60. The dielectric layer is preferably a plasma-enhanced oxide deposited by a chemical vapor deposition process using tetraethyl orthosilicate (TEOS) as a silicon source. Dopants are added to the reaction to form the doped oxide, Borophosphosilicate. In this case, the dielectric layer is called BP TEOS oxide. Other dielectrics, such as high-density plasma oxide (HDP oxide), could also be used. The dielectric layer 88 is deposited to a thickness of between about 5,000 Angstroms and 12,000 Angstroms.

As shown in FIG. 5, the MOS gates 78 are closely-spaced. Just as in the prior art, the spacing S2 is about 0.25 microns. At spacings of not more than 0.25 microns it is very difficult to get the dielectric layer 88 to fill the gap between the two MOS gates without creating voids. The void 92 shown in FIG. 5 extends through the area between the two MOS gates.

Figure 6:
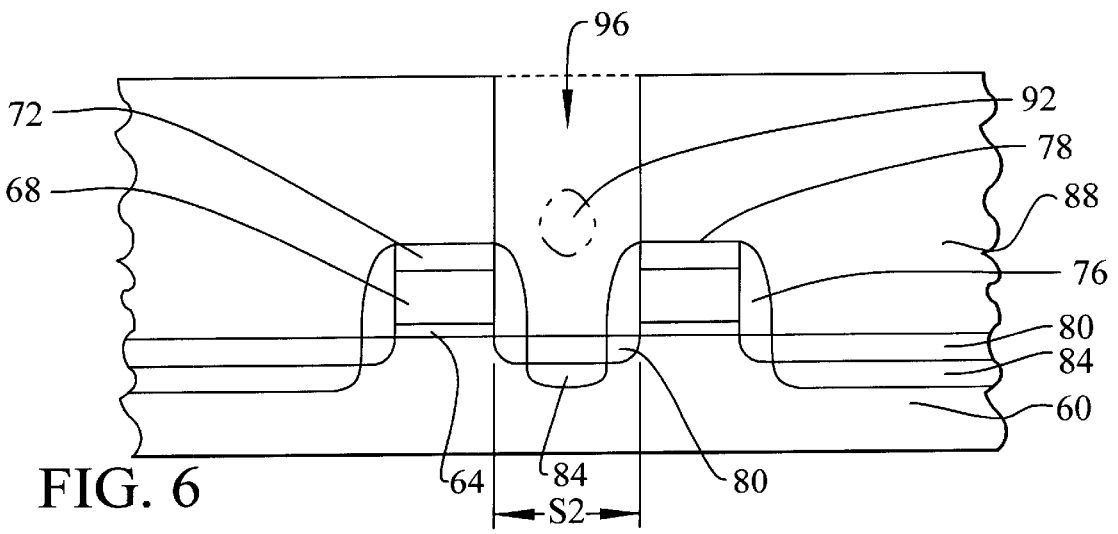

Referring now to FIG. 6, a contact opening 96 is etched through the dielectric layer 88. The contact opening is etched using a conventional reactive ion etch (RIE) where defined by a lithographic mask. The contact hole shown is a self-aligning contact. The contact opening 96 is called self-aligning because it is actually wider than the underlying opening at the surface of the substrate 60. The silicon nitride spacers 76 and caps 72 protect the MOS gate structures 78 during the dielectric layer 88 oxide etch process. The void 92 is partially etched away during the contact opening etch. Void 92 becomes a horizontal shaft or opening in the side of the contact hole.

Figure 7:
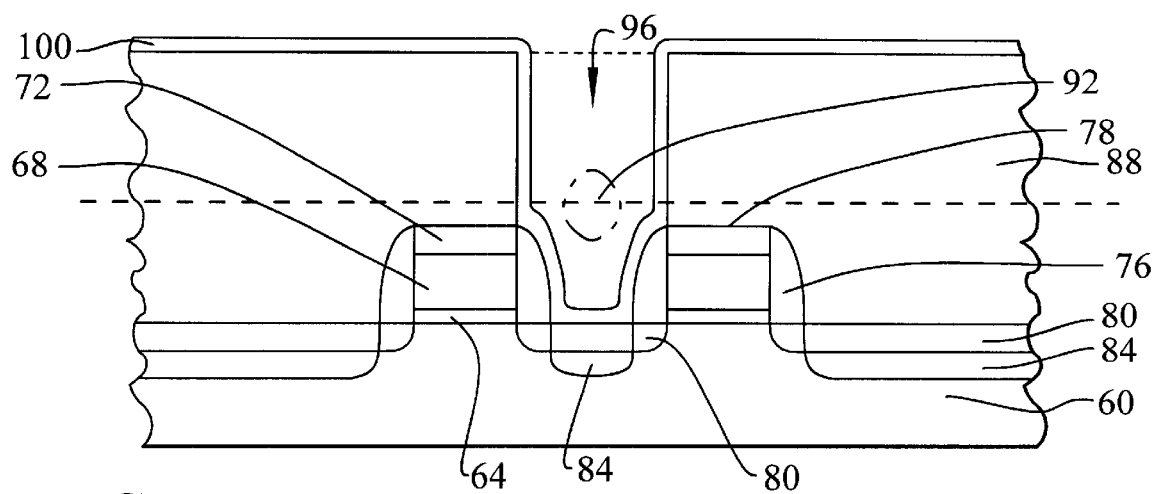

Referring now to FIG. 7, an important part of the present invention is described. An insulation film of oxide 100 is now deposited conformally overlying the dielectric layer 88 and within the contact opening 96. The insulating film also fills the void 92 to close off this path for potential conductive material shorting. The insulating layer 100 is preferably comprised of an oxide deposited using a low-pressure chemical vapor deposition process with tetraethyl orthosilicate as a source material (LP TEOS). The LP TEOS oxide is deposited to a thickness of between 200 and 1000 Angstroms. A sufficient amount of insulating oxide must be deposited to fill any exposed voids in the contact holes. If too much insulating oxide 100 is deposited, it will be very difficult to fill the contact opening 96 with conductive material later.

Figure 8:
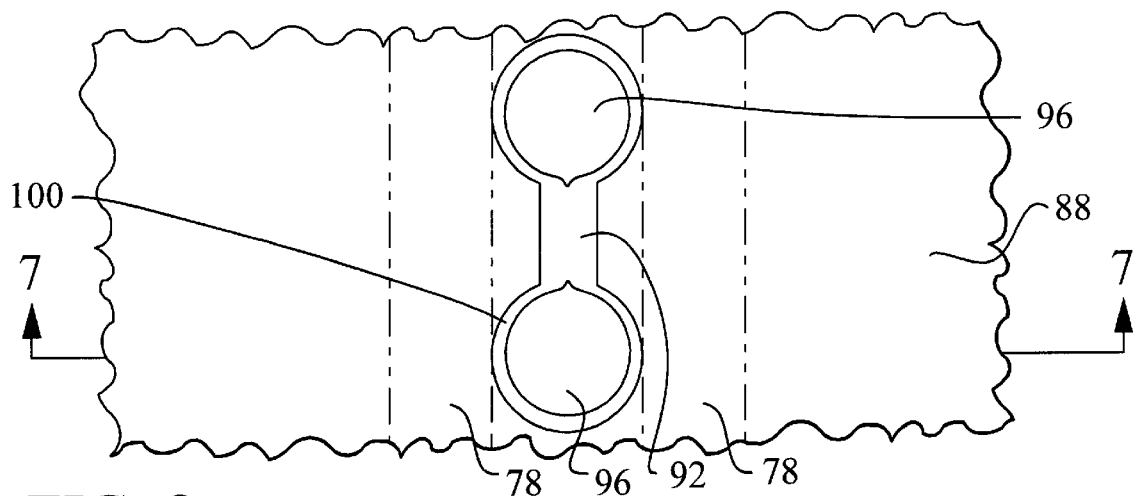
FIG. 8 is a top view of the view 7—7 shown in FIG. 7.

A top view of the partially completed structure of FIG. 7 is shown in FIG. 8. In FIG. 8 two adjacent contact openings 96 are shown. Both contact openings 96 are between the closely spaced MOS gates 78. A void 92 had been formed in the dielectric layer as described earlier. In this illustration, the void 92 extends from one contact to another, just as was the case in the prior art example. The novel usefulness of the insulating oxide 100 can now be clearly seen. The insulating oxide fills the void 92 so that the two contact holes 96 are physically and electrically isolated from each other.

Figure 9:
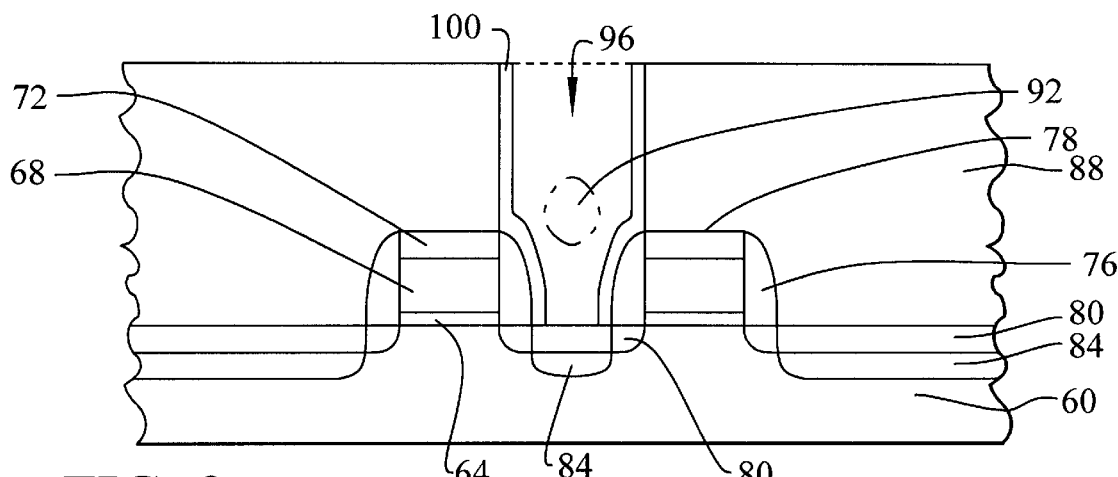

Referring now to FIG. 9, an anisotropic plasma etch is performed to remove the insulating oxide 100 from the bottom of the contact opening. A reactive ion etch (RIE) is performed using an etching chemistry comprising $CHF_3$ and $CF_4$ gases. The etch is adjusted to remove between about 400 and 1500 Angstroms of the insulating oxide 100 to insure that good ohmic contact is made between the conductive material deposited into the contact opening 96 and the bitline drain 84.

Figure 10:
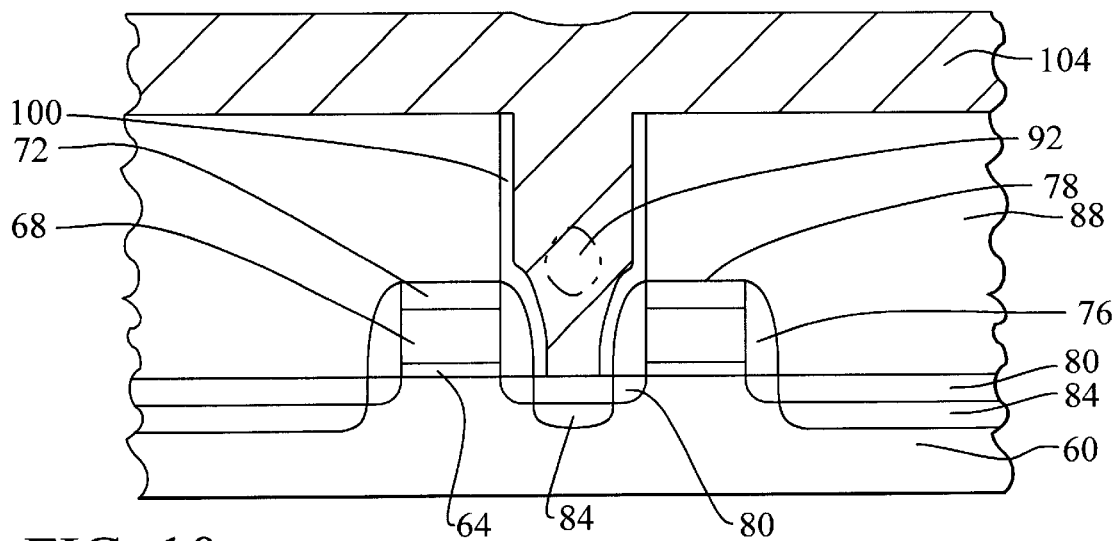

As shown in FIG. 10, a conductive layer 104 is deposited overlying the dielectric layer 88 and filling the contact opening. The conductive layer is composed preferably of a metal such as aluminum deposited conventionally.

Figure 11:
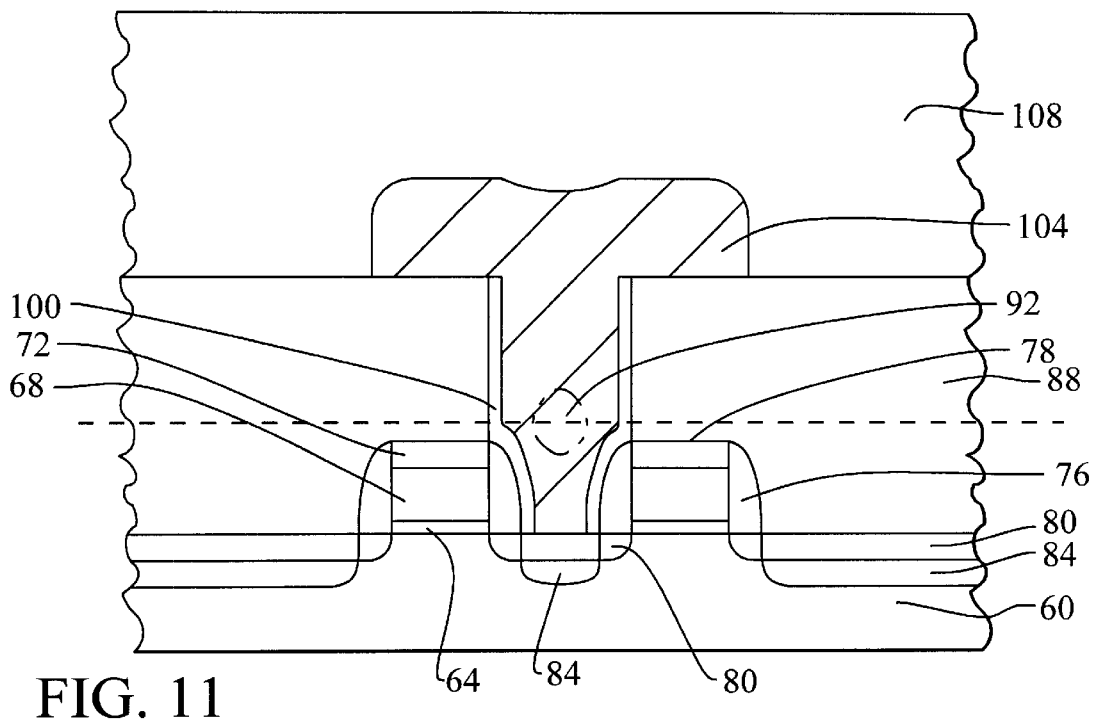

Referring now to FIG. 11, the conductive layer 104 is etched conventionally as defined by a lithographic mask. Connective traces are defined in the conductive layer 104. A plasma nitride layer 108 is then deposited overlying the conductive layer 104 and the exposed surface of the dielectric layer 88. This completes the fabrication of the integrated circuit.

Figure 12:
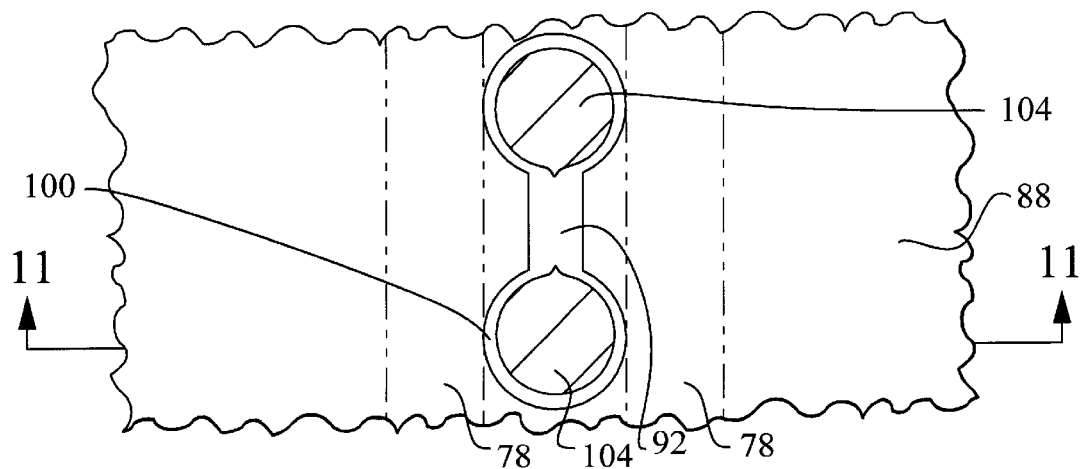
FIG. 12 is a top view of the view 11—11 shown in FIG. 11.

A top view of the completed structure shown in FIG. 11 is depicted in FIG. 12. Referring to FIG. 12, the two adjacent contacts are again shown between the two closely spaced MOS gate structures 78. The contacts are filled with the conductive layer 104. The void 92 in the dielectric layer 88 is shown filled by the insulating layer 100. The conductive layer 104 is contained within the contact openings and no shorting through the void region 92 occurs.

As has been shown in the preferred embodiment, this novel approach to the formation of contact openings eliminates shorting of conductive material through voids in dielectric layer between narrowly spaced adjacent MOS gates or conductive lines. Further, the process of the present invention provides a very manufacturable process.

While the invention has been particularly shown and described with reference to the preferred embodiments thereof, it will be understood by those skilled in the art that various changes in form and details may be made without departing from the spirit and scope of the invention.

What is claimed is:

1. A method to form contact openings in an integrated circuit device comprising:

providing conductive lines on a semiconductor substrate;

depositing a dielectric layer overlying said conductive lines and said semiconductor substrate wherein voids are formed in said dielectric layer between adjacent said conductive lines at sites of planned contact openings;

etching through said dielectric layer to the top surface of said semiconductor substrate to thereby form said contact openings;

depositing an insulating layer overlying said dielectric layer and filling said contact openings wherein said insulating layer forms a lining layer inside said contact openings and fills said voids in said dielectric layer extending out of said contact openings; and etching through said insulating layer to expose said top surface of said semiconductor substrate to complete said contact openings in said integrated circuit device.

2. The method according to claim 1, further comprising:

depositing a conductive layer overlying said dielectric layer and filing said contact openings; and patterning said conductive layer to form second conductive lines.

* * * * *